(12) United States Patent
Hong

(10) Patent No.: US 9,397,420 B2
(45) Date of Patent: Jul. 19, 2016

(54) CARD SLOT STRUCTURE HAVING AN AUTOMATIC CARD EJECTION FUNCTION

(71) Applicant: Acer Incorporated, New Taipei (TW)

(72) Inventor: Yew-Chung Hong, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 14/630,667

(22) Filed: Feb. 25, 2015

(65) Prior Publication Data

US 2016/0093962 A1    Mar. 31, 2016

(30) Foreign Application Priority Data

Sep. 26, 2014  (TW) .............................. 103133507 A

(51) Int. Cl.
| H01R 13/44 | (2006.01) |
| H01R 12/70 | (2011.01) |
| H01R 13/447 | (2006.01) |
| H01R 12/71 | (2011.01) |
| G06F 1/16 | (2006.01) |
| G06K 13/08 | (2006.01) |
| H04M 1/02 | (2006.01) |
| H05K 5/02 | (2006.01) |
| H04B 1/3818 | (2015.01) |

(52) U.S. Cl.
CPC .......... *H01R 12/7058* (2013.01); *G06F 1/1658* (2013.01); *G06K 13/0825* (2013.01); *G06K 13/0831* (2013.01); *H01R 12/71* (2013.01); *H01R 13/447* (2013.01); *H04B 1/3818* (2015.01); *H04M 1/026* (2013.01); *H05K 5/0295* (2013.01); *H04M 2250/14* (2013.01)

(58) Field of Classification Search
CPC .. H01R 13/447; H01R 13/637; H01R 13/523; H01R 13/633; H01R 23/7005

USPC .......................................... 439/136, 159, 160
See application file for complete search history.

(56) References Cited

U.S. PATENT DOCUMENTS

| 6,174,180 B1 * | 1/2001 | Chen ..................... G06K 13/08 439/159 |
| 7,066,748 B2 * | 6/2006 | Bricaud ................ G06K 13/08 439/159 |
| 2008/0153364 A1 * | 6/2008 | Tanaka .................. H01R 12/57 439/862 |
| 2013/0063910 A1 | 3/2013 | Chao et al. |
| 2013/0240629 A1 | 9/2013 | Pesonen et al. |
| 2014/0029211 A1 | 1/2014 | Gao |
| 2014/0322939 A1 * | 10/2014 | Lin ..................... H01R 13/447 439/136 |

FOREIGN PATENT DOCUMENTS

EP            1729245        12/2006

* cited by examiner

*Primary Examiner* — Abdullah Riyami
*Assistant Examiner* — Thang Nguyen
(74) *Attorney, Agent, or Firm* — Jianq Chyun IP Office

(57) ABSTRACT

A card slot structure is disposed in a housing of an electronic device. The card slot structure includes a slot, a cover door, and a push portion, wherein the slot has a push-push type unit. A card is adapted to be fixed in or ejected from the slot through the push-push type unit along a first axial direction. The cover door is slidably disposed in the housing along a second axial direction for opening or closing the slot. A push portion is connected to the cover door. As the cover door slides along the second axis to open the slot, a portion of the card located in the moving path of the push portion is pushed into the slot to trigger the push-push type unit. As the push portion moves away from the card, the card is ejected from the slot through the push-push type unit.

10 Claims, 3 Drawing Sheets

CARD SLOT STRUCTURE HAVING AN AUTOMATIC CARD EJECTION FUNCTION

CROSS-REFERENCE TO RELATED APPLICATION

This application claims the priority benefit of Taiwan application serial no. 103133507, filed on Sep. 26, 2014. The entirety of the above-mentioned patent application is hereby incorporated by reference herein and made a part of this specification.

BACKGROUND

1. Technical Field

The invention relates to a card slot structure, and particularly relates to a card slot structure having an automatic card ejection function.

2. Related Art

Along with development of technology, users can use digital electronic devices, such as digital cameras, smart phones, tablet personal computers (PCs) and mobile phones, etc. to obtain required information at anytime anywhere in daily life. In the use of a smart phone or a mobile phone, a phone number generally corresponds to a subscriber identify module (SIM) card, so as to preserve identification (ID) data of the user using the mobile phone service and store message data and telephone numbers. On the other hand, as consumers have higher demand on the quality of digital images, digital music, etc., demand on capacity of the storage medium becomes higher. Presently, the capacity of the inbuilt storage medium of the electronic device is limited by a profile design or consideration of a manufacturing cost, such that a magnitude thereof cannot satisfy use's requirement on storage capacity. Therefore, flash memory card having advantages of small size, large storage capacity, short access time, easy to be plugged, and easy to be carried around, etc. have become a main stream of the storage media of the electronic device, which can be used to effectively expand an extra storage space of the electronic device.

In order to connect the SIM card and the flash memory card with the mobile phone or the electronic device, a general manner is to set a slot at an edge of a housing of the mobile phone or the electronic device, and insert the SIM card or the flash memory card into the slot for connecting a connection terminal of the mobile phone or the electronic device. However, in a current configuration of the electronic device, when the user wants to take out the SIM card or the flash memory card from the mobile phone or the electronic device, i.e. when a card ejection procedure of the SIM card or the flash memory card is performed, multiple steps are generally involved, which may cause utilization inconvenience. In detail, when the SIM card or the flash memory card is taken out, a cover door of the housing corresponding to the slot is first opened, and an external force is exerted to press the SIM card or the flash memory card into the slot, so as to reach a card release position. Therefore, a plurality of card ejection steps have to be performed in order to complete the whole card ejection procedure.

SUMMARY

The invention is directed to a card slot structure, which has a cover door mechanism capable of implementing automatic card ejection of a card, such that a user is capable of completing the whole card ejection procedure through a single card ejection step.

An embodiment of the invention provides a card slot structure, which is installed in a housing of an electronic device. The card slot structure includes a slot, a cover door, and a push portion. The slot is disposed in the housing, and has a push-push type unit. A card is adapted to be inserted and fixed in the slot through the push-push type unit along a first axial direction, or ejected from the slot through the push-push type unit along the first axial direction. The cover door is slidably disposed in the housing along a second axial direction for opening or closing the slot, where the first axial direction is orthogonal to the second axial direction. The push portion is connected to the cover door and slides along with the cover door. When the card is fixed in the slot, and the cover door slides along the second axial direction to open the slot, a portion of the card is located on a moving path of the push portion, such that when the push portion passes by the card, the push portion pushes the card to move along the first axial direction to trigger the push-push type unit. After the push portion moves away from the card, the card is ejected from the slot through the push-push type unit. When the card is fixed in the slot, and the cover door slides along the second axial direction to close the slot, the card is not located on the moving path of the push portion.

According to the above descriptions, according to the card slot structure of the invention, when the user ejects a subscriber identify module (SIM) card or a flash memory card of a mobile electronic device from a card slot having a cover door, the user is capable of completing the whole card ejection procedure through a single card ejection step or action, In detail, the user is only required to open the cover door of the slot during the process of card ejection, and the card is automatically ejected from the slot, and the user is unnecessary to perform other extra card ejection steps. Therefore, according to the present invention, usage inconvenience of the user caused by excessive steps in card ejection is avoided.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
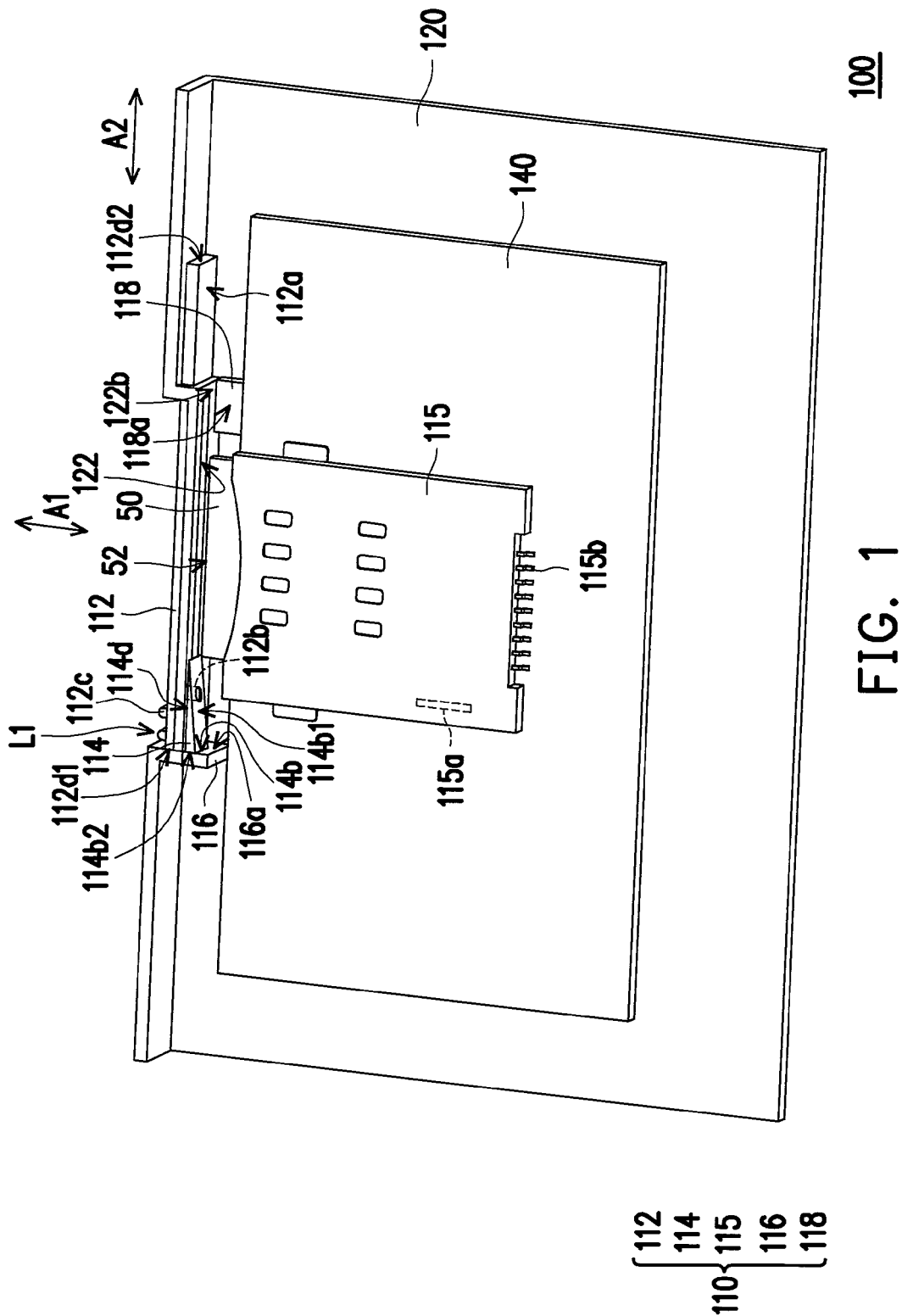
FIG. 1 is a three-dimensional view of a card slot structure according to an embodiment of the invention.

FIG. 1 is a three-dimensional view of a card slot structure according to an embodiment of the invention. Referring to FIG. 1, in the present embodiment, the card slot structure 110 is installed in a housing 120 of an electronic device 100. The card slot structure 110 includes a slot 115, a cover door 112, and a push portion 114. The cover door 112 is slidably disposed in the housing 120. The slot 115 is disposed in the housing 120, and has a push-push type unit 115a, which is only schematically illustrated, and detailed structural features thereof can be learned according to the existing technique. Moreover, a card 50 is adapted to be inserted and fixed in the slot 115 through the push-push type unit 115a along a first axial direction A1, and is located at a card holding position, or the card 50 is adapted to be ejected from the slot 115 through the push-push type unit 115a along the first axial direction A1. The cover door 112 is slidably disposed in the housing 120 along a second axial direction A2 for opening or closing the slot 115. In the present embodiment, the second axial direction A2 is orthogonal to the first axial direction A1.

In detail, the push-push type unit 115a of the slot 115 buckle or de-buckle the card 50 to achieve a card insertion or card ejection effect. In other words, the card 50 can be pushed into the slot 115 and buckled to the push-push type unit 115a, or the card 50 can be further pushed to release the buckling relationship between the push-push type unit 115a and the card 50. On the other hand, the push-push type unit 115a has a pressing mechanism (not shown), which can further push the card 50 out of the housing 120 when the card 50 is ejected from the slot 115. Moreover, the card 50 located at the card holding position can be electrically connected to a printed circuit board 140 through connection terminals 115b of the slot 115, such that the electronic device 100 can read and write the card 50.

Figure 2:
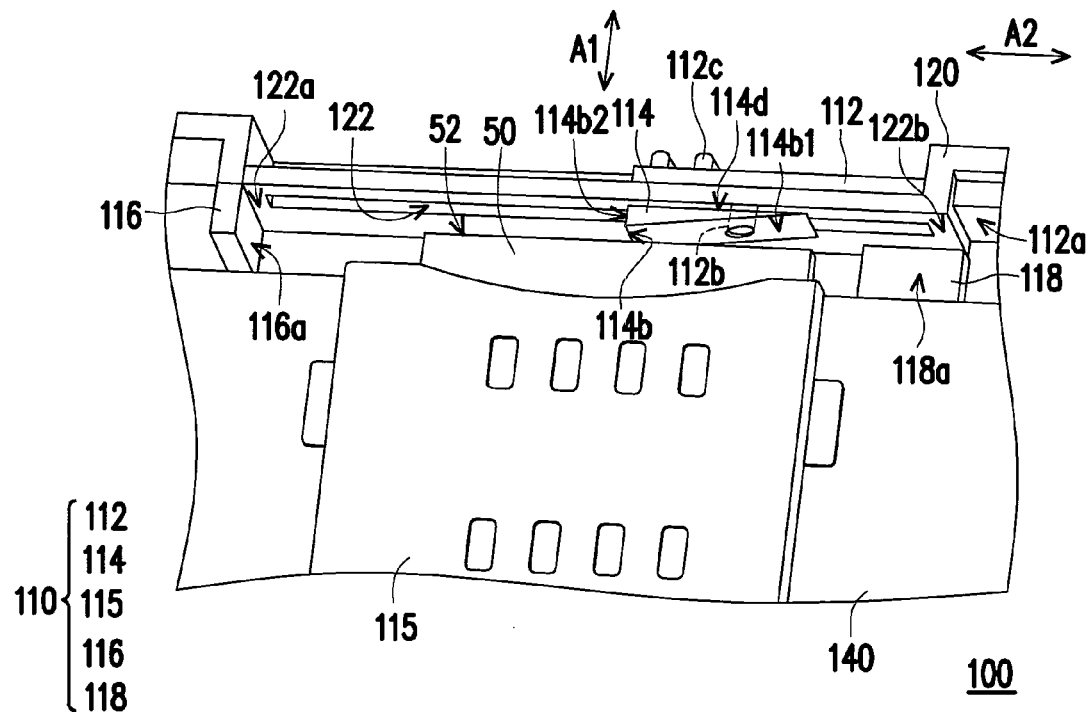
FIG. 2 is a partial schematic diagram of the card slot structure of FIG. 1 according to one viewing angle.
Figure 3:
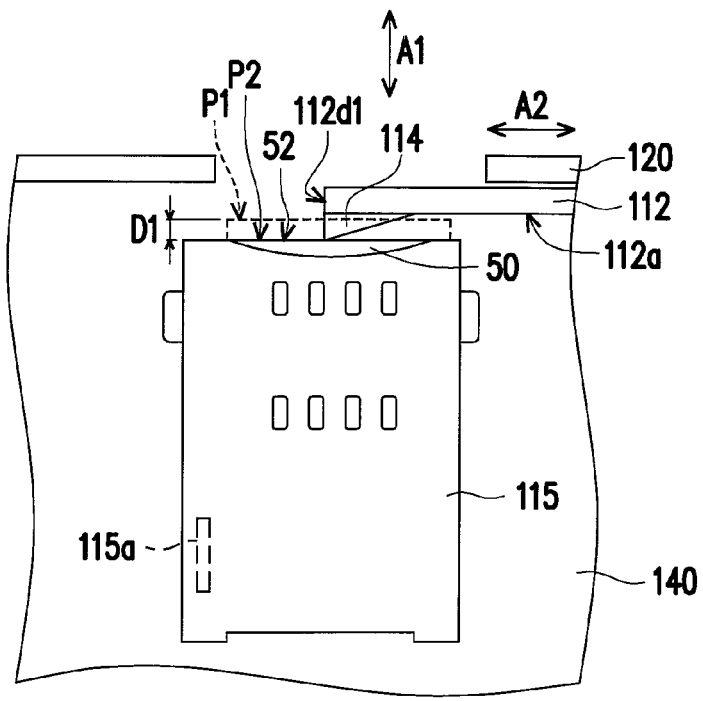
FIG. 3 is a partial schematic diagram of the card slot structure of FIG. 1 according to another viewing angle.

FIG. 2 and FIG. 3 are partial schematic diagrams respectively illustrating the card slot structure of FIG. 1 in a card ejection process according to different viewing angles. Referring to FIG. 1 to FIG. 3, the push portion 114 is connected to the cover door 112 and slides along with the cover door 112. As shown in FIG. 1, when the card 50 is fixed in the slot 115, the cover door 112 is located at a close position L1, and the card 50 has a side edge 52 extending along the second axial direction A2, which is located on a moving path of the push portion 114 and is adapted to be pushed by the push portion 114. Therefore, when the cover door 112 slides along the second axial direction A2 to open the slot 115, the push portion 114 passes by and pushes the card 50, such that the card 50 is moved towards the internal of the slot 115 along the first axial direction A1 by a distance D1 from the card holding position P1 to an initial card ejection position P2, so as to trigger the push-push type unit 115a to release the card 50.

Figure 4:
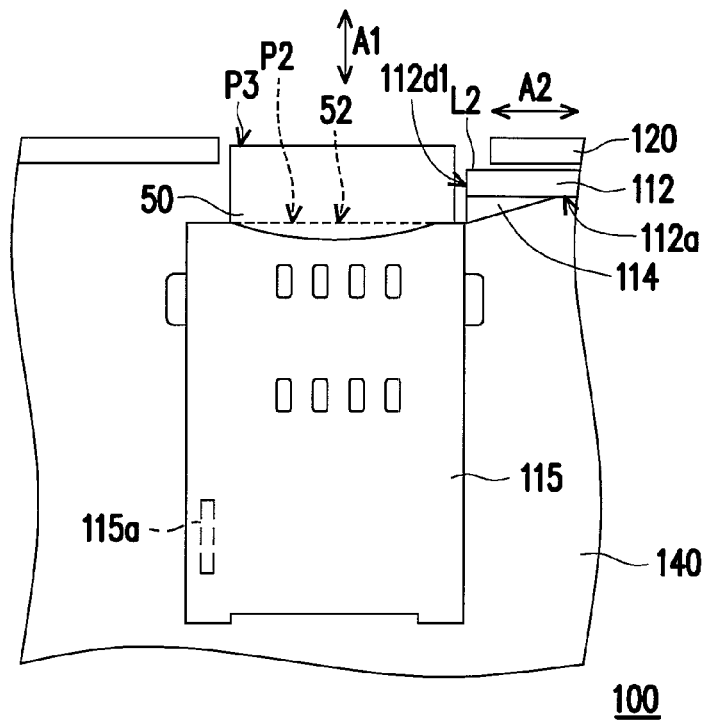
FIG. 4 is a partial schematic diagram of the card slot structure of FIG. 1 according to one viewing angle when card ejection is completed.
Figure 5:
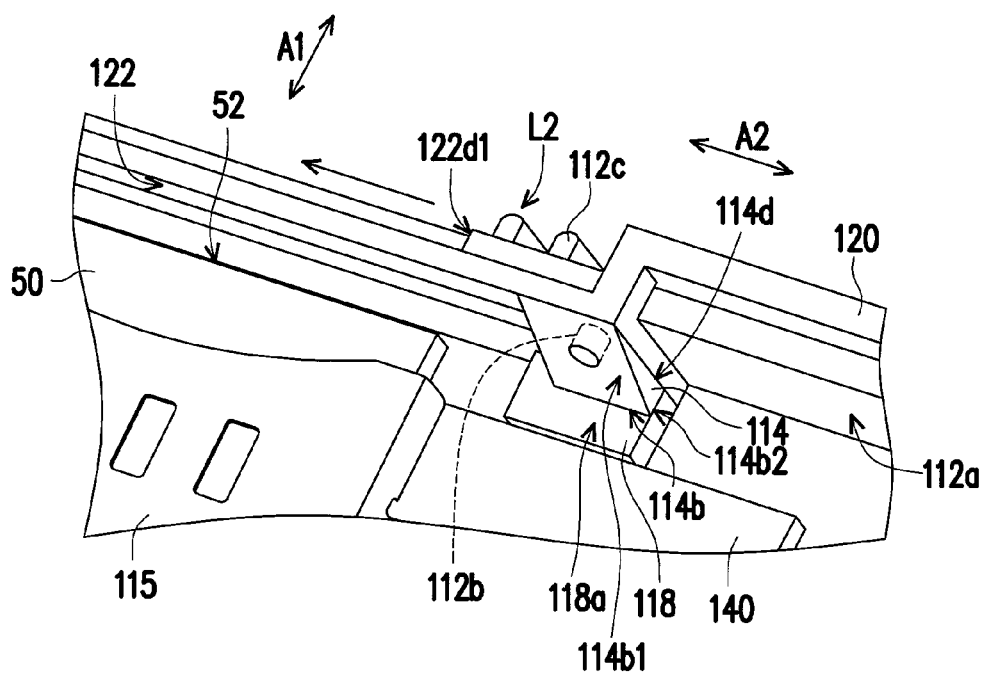
FIG. 5 is a partial schematic diagram of the card slot structure of FIG. 1 according to another viewing angle when card ejection is completed.

On the other hand, FIG. 4 and FIG. 5 are respectively partial schematic diagrams of the card slot structure of FIG. 1 according to different viewing angles when card ejection of the card slot structure 110 is completed. Referring to FIG. 2 to FIG. 5, according to the above descriptions, when the cover door 112 continuously slides along the second axial direction A2 to an open position L2 shown in FIG. 4 (FIG. 5), the cover door 112 drives the push portion 114 to completely move away from the card 50. Meanwhile, the card 50 moves away from the slot 115 to a final card ejection position P3 (shown in FIG. 4) along the first axial direction A1 through the push-push type unit 115a, and presents a release and ejection state. In this way, the card ejection step of the card 50 is completed.

Referring to FIG. 3, in the present embodiment, the distance D1 of a card ejection stroke of the card 50 is at least but not limited to 0.8 mm, which is determined by a card insertion and card ejection mechanism provided by the push-push type unit 115a, and can also be suitably changed and adjusted according to an actual application requirement. Moreover, when the card 50 is moved to the initial card ejection position P2, since the cover door 112 is not completely opened, the push portion 114 can also serve as a block portion to continuously push the card 50 into the slot 115, so as to prevent the card 50 from ejecting towards a direction of the cover door 112 to impact the cover door 112 before the cover door 112 is completely opened.

Referring to FIG. 2 and FIG. 3, in the present embodiment, the push portion 114 is a wedge body, which has a bottom surface 114d and a protruding portion 114b. The protruding portion 114b extends along the first axial direction A1 away from the cover door 112, and the protruding portion 114b has an inclined surface 114b1 and an end surface 114b2 relative to the bottom surface 114d, and the bottom surface 114d is adjacent to the inclined surface 114b1 and the end surface 114b2. In the present embodiment, the inclined surface 114b1 is inclined towards the first axial direction A1 by an angle relative to the bottom surface 114d and is extends along a plane of the second axial direction A2, such that the inclined surface 114b1 can progressively contact and push the card 50 when moving along the second axial direction A2, i.e. the card 50 can move along the inclined surface 114b1 to achieve an effect that the push portion 114 pushes the card 50 towards the direction of the slot 115. Moreover, the end surface 114b2 is connected between the inclined surface 114b1 and the bottom surface 114d, and a length of the end surface 114b2 along the first axial direction A1 (which is equivalent to a distance between the protruding portion 1114b and the bottom surface 114d in the wedge body) is equal to a moving distance of the card 50 (a distance that the card 50 is moved from the card holding position P1 to the initial card ejection position P2) when the inclined surface 114b1 pushes the card 50 to move relative to the slot 115, i.e. the aforementioned card ejection distance D1 of the card 50.

Moreover, the housing 120 includes a notch 122 extending along the second axial direction A2, and the cover door 112 has a pivot 112b and a side surface 112a facing the slot 115, where the pivot 112b penetrates through the notch 122 and is pivoted between the side surface 112a and the bottom surface 114d of the push portion 114 parallel to each other. In this way, the cover door 112 can drive the push portion 114 to move along the notch 122, and the push portion 114 can be pivotally rotated relative to the cover door 112 through the pivot 112b.

On the other hand, in the present embodiment, the cover door 112 has side edges 112d1 and 112d2 at two ends along an extending direction thereof. Moreover, the cover door 112 may include at least one convex rib 112c disposed on another side surface of the cover door 112 opposite to the side surface 112a, and is located adjacent to the side edge 112d1, where an extending direction of the convex rib 112c is perpendicular to the second axial direction A2. By configuring the convex rib 112c, when the user exerts an external force on the cover door 112 to opening the slot 115, a contact friction between the user and the cover door 112 is increased. Therefore, the user can easily push the cover door 112 to open the slot 115 and complete the card rejection procedure of the card 50. Moreover, the number of the configured convex ribs 112c can be adjusted according to an actual application requirement.

In addition, the card slot structure 110 further includes a first magnetic element 116 and a second magnetic element 118, which are respectively disposed at a first end 122a and a second end 122b of the notch 122 opposite to each other. In the present embodiment, the first magnetic element 116 is located on an extending path of the notch 122, and the second magnetic element 118 is away from the extending path of the notch 122. Moreover, the first magnetic element 116 has a magnetic attraction surface 116a perpendicular to the second axial direction A2, and the second magnetic element 118 has a magnetic attraction surface 118a parallel to the second axial direction A2. The push portion 114 has magnetic conductibility, and the end surface 114b2 thereof can be magnetically attracted by the magnetic attraction surface 116a of the first magnetic element 116 or the magnetic attraction surface 118a of the second magnetic element 118. In collaboration with the influence of the pivot 112b, when the push portion is close to the first magnetic element 116 or the second magnetic element 118, the end surface 114b2 of the push portion 114 is attracted by the magnetic attraction surface 116a or the magnetic attraction surface 118a and is rotated to different states, so as to change a configuration direction of the push portion 114 relative to the card 50 and the cover door 112.

In detail, when the cover door 112 closes the slot 115, the end surface 114b2 of the push portion 114 is attracted by the magnetic attraction surface 116a of the first magnetic element 116 and is laterally configured, i.e. configured along the second axial direction A2. When the force exerted on the cover door 112 by the user is greater than the magnetic attraction between the end surface 114b2 and the magnetic attraction surface 116a, the cover door 112 drives the push portion 114 to move towards a direction of the second end 122b of the notch 122, and the push portion 114 still maintains the lateral configuration, such that the inclined surface 114b1 thereof can push the card 50. When the user pushes the cover door 112 to the open position L2, the end surface 114b2 of the push portion 114 is attracted by the magnetic attraction surface 118a of the second magnetic element 118, and is rotated to present a vertical configuration, i.e. the configuration direction thereof is simultaneously perpendicular to the first axial direction A1 and the second axial direction A2, and a rotating angle thereof is 90 degrees. Moreover, the cover door 112 can be temporarily fixed to the open position L2 through the magnetic attraction between the push portion 114 and the second magnetic element 118.

According to the above descriptions, under the open state of the slot 122, the user can re-insert the card 50 into the slot 115 through the notch 122, and the card 50 is fixed in the slot through the push-push type unit 115a. Then, the cover door 112 is moved to the close position L1 from the open position L2, and since the push portion 114 is vertically configured, the card 50 in the slot 115 is not located on the moving path of the protruding portion 114b of the push portion 114, i.e. the protruding portion 114b and the side edge 52 of the card 50 maintain a proper distance therebetween without contacting, such that during a close process of the cover door 112, the card 50 does not bear a force to trigger the push-push type unit 115a to eject from the slot 115. Once the cover door 112 is moved to the close position L1, the end surface 114b2 of the push portion 114 is again attracted by the first magnetic element 116, and is pivotally rotated by 90 degrees to present the lateral configuration, so as to facilitate exerting a force to the card 50 to eject it from the slot 115 when the cover door 112 is opened later.

In summary, in the embodiment of the invention, when the cover door slides, the push portion of the card slot structure pushes the card to move inward the slot to trigger the push-push type unit, such that the card is released from the push-push type unit, and after the cover door is opened, the card can be ejected from the slot. Therefore, the user can move the cover door to complete ejecting the card through a single action. Moreover, the push portion is connected to the cover door through a pivot and has magnetic conductibility, and in collaboration with the magnetic elements with different configuration directions located at two ends of the notch, the push portion can be attracted by the magnetic elements for rotating, such that when the push portion moves along with the cover door to close the slot, the card is not located on the moving path of the push portion, so as to avoid triggering the push-push type unit when the cover door is closed. In this way, the card slot structure of the invention can simplify the operation behaviour of the user using the electronic device, so as to improve operation convenience of the electronic device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A card slot structure having an automatic card ejection function, installed in a housing of an electronic device, and comprising:
   a slot, disposed in the housing, and having a push-push type unit, wherein a card is adapted to be inserted and fixed in the slot through the push-push type unit along a first axial direction, or ejected from the slot through the push-push type unit along the first axial direction;
   a cover door, slidably disposed in the housing along a second axial direction, wherein the first axial direction is orthogonal to the second axial direction; and
   a push portion, connected to the cover door and moved along with the cover door,
   wherein when the card is fixed in the slot, and the cover door slides along the second axial direction to open the slot, a portion of the card is located on a moving path of the push portion, such that the push portion pushes the card to move along the first axial direction to trigger the push-push type unit, and after the push portion moves away from the card, the card is ejected from the slot through the push-push type unit,
   wherein when the card is fixed in the slot, and the cover door slides along the second axial direction to close the slot, the card is not located on the moving path of the push portion.

2. The card slot structure having an automatic card ejection function as claimed in claim 1, further comprising:
   a pivot, connected to the cover door and the push portion, such that the push portion is rotated relative to the cover door in the first axial direction.

3. The card slot structure having an automatic card ejection function as claimed in claim 2, wherein the housing has a notch extending along the second axial direction, the pivot is slidably coupled to the notch, such that the cover door and the push portion are adapted to slide along the notch, and the card is inserted in or ejected from the slot though the notch along the first axial direction.

4. The card slot structure having an automatic card ejection function as claimed in claim 3, further comprising:
   a first magnetic element, disposed at a first end of the notch and located on an extending path of the notch; and
   a second magnetic element, disposed at a second end of the notch and located away from the extending path of the notch, wherein the first end is opposite to the second end, and the push portion has magnetic conductibility,
   wherein when the cover door closes the slot, the cover door closes the notch, and the push portion is moved to the first end of the notch and is attracted by the first magnetic element,
   wherein when the cover door opens the slot, the cover door opens the notch, and the push portion is moved to the second end of the notch and is attracted by the second magnetic element.

5. The card slot structure having an automatic card ejection function as claimed in claim 4, wherein the push portion is respectively attracted by the first magnetic element and the second magnetic element to form different states, and a difference between the different states is generated when the push portion is rotated through the pivot by an angle.

6. The card slot structure having an automatic card ejection function as claimed in claim 5, wherein the angle is 90 degrees.

7. The card slot structure having an automatic card election function as claimed in claim 4, wherein the push portion is a wedge body having a bottom surface and a protruding portion, the bottom surface is connected to the pivot, and the protruding portion extends along the first axial direction away from the cover door, when the card is fixed in the slot, and the cover door slides along the second axial direction to open the slot, a portion of the card is located on the moving path of the protruding portion.

8. The card slot structure having an automatic card ejection function as claimed in claim 7, wherein the protruding portion has an inclined surface and an end surface relative to the bottom surface, the bottom surface is adjacent to the inclined surface and the end surface, and the end surface is adapted to be attracted by the first magnetic element and the second magnetic element to rotate the push portion to form different states.

9. The card slot structure having an automatic card ejection function as claimed in claim 8, wherein when the push portion moves along with the cover door to push the card, the card moves along the inclined surface.

10. The card slot structure having an automatic card ejection function as claimed in claim 8, wherein a distance between the protruding portion and the bottom surface is complied with a card ejection distance of the push-push type unit.

\* \* \* \* \*